(12) United States Patent
Jain

(10) Patent No.: US 8,253,205 B2
(45) Date of Patent: Aug. 28, 2012

(54) METHOD FOR FORMING STRAINED CHANNEL PMOS DEVICES AND INTEGRATED CIRCUITS THEREFROM

(75) Inventor: Amitabh Jain, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 44 days.

(21) Appl. No.: 13/016,393

(22) Filed: Jan. 28, 2011

(65) Prior Publication Data

US 2011/0133287 A1 Jun. 9, 2011

Related U.S. Application Data

(62) Division of application No. 12/345,851, filed on Dec. 30, 2008, now Pat. No. 7,902,032.

(60) Provisional application No. 61/022,396, filed on Jan. 21, 2008.

(51) Int. Cl.
*H01L 21/70* (2006.01)

(52) U.S. Cl. .................. 257/368; 257/369; 257/E27.06; 257/E29.193

(58) Field of Classification Search .................. 257/368, 257/369, E27.06, E29.193
See application file for complete search history.

(56) References Cited

U.S. PATENT DOCUMENTS

| | | |
|---|---|---|
| 5,212,101 A | 5/1993 | Canham et al. |
| 6,846,720 B2 | 1/2005 | Balasubramanian et al. |
| 2005/0035409 A1 | 2/2005 | Ko et al. |
| 2007/0013002 A1 | 1/2007 | Schruefer |
| 2008/0044938 A1 | 2/2008 | England et al. |
| 2008/0121821 A1 | 5/2008 | Muka et al. |
| 2008/0124903 A1 | 5/2008 | England et al. |

*Primary Examiner* — Tan N Tran

(74) *Attorney, Agent, or Firm* — Jacqueline J. Garner; Wade J. Brady, III; Frederick J. Telecky, Jr.

(57) ABSTRACT

An integrated circuit (IC) includes a plurality of compressively strained PMOS transistors. The IC includes a substrate having a semiconductor surface. A gate stack is formed in or on the semiconductor surface and includes a gate electrode on a gate dielectric, wherein a channel region is located in the semiconductor surface below the gate dielectric. A source and a drain region is opposing sides of the gate stack. At least one compressive strain inducing region including at least one specie selected from Ge, Sn and Pb is located in at least a portion of the source and drain regions of the PMOS transistors, wherein the strain inducing region provides $\leq 10^{10}$ dislocation lines/cm$^2$ and an active concentration of the compressive strain inducing specie that is above a solid solubility limit for the compressive strain inducing specie in the compressive strain inducing region. A method for forming compressively strained PMOS transistors includes implanting on at least opposing sides of the gate stack using at least one compressive strain inducing specie selected from Ge, Sn and Pb at a dose $\geq 1 \times 10^{15}$ cm$^{-2}$, at an implantation temperature during implanting in a temperature range $\leq 273$ K, wherein the implant conditions are sufficient to form an amorphous region. The wafer is annealed using annealing conditions including a peak anneal temperature of between 1050° C. and 1400° C. and an anneal time at the peak temperature of $\leq 10$ seconds, wherein the amorphous region recrystallizes by solid phase epitaxy (SPE).

5 Claims, 2 Drawing Sheets

METHOD FOR FORMING STRAINED CHANNEL PMOS DEVICES AND INTEGRATED CIRCUITS THEREFROM

CROSS REFERENCE TO RELATED APPLICATIONS

This application is a division of prior application Ser. No. 12/345,851, filed Dec. 30, 2008 entitled "Method For Forming Strained Channel PMOS Devices and Integrated Circuits Therefrom" which claims the benefit of Provisional Application Ser. No. 61/022,396 entitled "USE OF REDUCED IMPLANTATION TEMPERATURE TO ACHIEVE HIGH QUALITY STRESS ENHANCEMENT LAYERS FOR CMOS PERFORMANCE BOOST", filed Jan. 21, 2008, which is herein incorporated by reference in its entirety.

FIELD OF THE INVENTION

Embodiments of the present invention relate to integrated circuits (ICs) including compressively strained PMOS devices.

BACKGROUND

Increased device density, together with higher speed performance and lower power consumption are major driving forces in efforts to improve IC devices and IC manufacturing methods. For example, CMOS design considerations for high speed digital applications are usually determined by the pull up time and pull down time for each individual gate. Gates have an associated delay time period for signal propagation. The delay time period, in turn, is inversely proportional to the drive current ($I_{drive}$). Maximizing the drive current increases the speed of a CMOS device.

Mechanical stresses are known to play a role in charge carrier mobility which affect several device parameters including Voltage threshold ($V_T$) shift, drive current saturation ($I_{Dsat}$), and drive current ($I_{drive}$). Of particular importance as a measure of the speed of device performance is the value of $I_{on}$-$I_{off}$ (also referred to as ($I_{drive}$)). An increase in charge carrier mobility in the channel region of the MOS device will generally increase the drive current ($I_{drive}$).

One process for introducing mechanical strain into the channel region of the device is by implanting suitable species then annealing since the strain inducing species must be introduced substitutionally into the substrate lattice to generally be effective. Interstitial sites in the lattice are generally not effective in providing strain, and can instead result in increased defectivity. Species having a size larger than the size of the substrate atoms provide compressive strain and species smaller than the substrate atoms provide tensile strain. Such implant processes are generally performed at room temperature, and the associated annealing process is typically a relatively long processing time, such as on the order of several minutes, or more. Known strain implant/anneal approaches in general suffer from high manufacturing cost, process integration issues and difficulty in producing acceptable device quality due to high levels of residual end-of-range disorder in the completed devices.

As known in the art, end-of-range disorder refers to dislocation loops that are located beyond the amorphization region created by the implant that generally result in residual defects in the final IC that can reduce yield, device performance and in some cases device reliability. Conventional strain implant/anneal processes generally result in defect density of $\geq 10^{13}$ dislocation lines/cm$^2$ primarily resulting from residual end of range disorder generated defects. These and other shortcomings demonstrate a continuing need in MOS device manufacturing for new strained channel MOS devices and manufacturing methods to reliably and predictably achieve significantly improved device performance while ensuring high yield and device reliability.

SUMMARY

This Summary is provided to comply with 37 C.F.R. §1.73, presenting a summary of the invention to briefly indicate the nature and substance of the invention. It is submitted with the understanding that it will not be used to interpret or limit the scope or meaning of the claims.

Embodiments of the present invention describe methods for forming strained channel MOS devices and ICs therefrom based on sub-room temperature implantation of at least one strain inducing species, and high temperature anneal processing to achieve solid phase epitaxy (SPE). The low temperature implant process has been found by the Present Inventor to produce amorphousness without appreciable recoil of substrate (e.g. Si) atoms, thus expanding the amorphous zone. Expansion of the amorphous zone has been found by the Present Inventor to reduce the end of range disorder generated by the implant. Moreover the low temperature used during implanting also limits self annealing that can otherwise occur during the implant.

One embodiment of the invention comprises a method of forming an IC including a plurality of compressively strained PMOS devices. A substrate wafer having a semiconductor surface including at least one PMOS region is provided. A patterned gate stack comprising a gate electrode on a gate dielectric is formed on a surface of the PMOS region. The PMOS region is implanted on at least opposing sides of the gate stack using implant conditions comprising at least one compressive strain inducing specie selected from Ge, Sn and Pb at a dose $\geq 1 \times 10^{15}$ cm$^{-2}$, and at an implantation temperature for the wafer during the implanting in a temperature range $\leq 273$ K, wherein the implant conditions are sufficient to form an amorphous region. The wafer is then annealed using annealing conditions comprising a peak anneal temperature of between 1050° C. and 1400° C. and an anneal time at the peak temperature of $\leq 10$ seconds, wherein the amorphous region recrystallizes by SPE. The fabrication of the IC including the PMOS device is then completed.

Performing the anneal at a high temperature (e.g. $\geq 1150°$ C.) for a short time at the high temperature (e.g. $\leq 10$ seconds) has been found by the Present Inventor to limit undesirable strain relaxation. Moreover, such anneals have been found to result in compressive strain inducing atoms getting into the substrate lattice in concentrations well above (e.g. typically at least 2×) their equilibrium solid solubility limit in the substrate material. Methods according to embodiments of the invention have also been found to substantially reduce the residual end-of-range disorder in the completed devices being $\leq 10^{10}$ dislocation lines/cm$^2$, and generally $\leq 10^8$ dislocation lines/cm$^2$, leading to improved device performance, a yield improvement and in some instances a reliability improvement.

DETAILED DESCRIPTION

Figure 1:
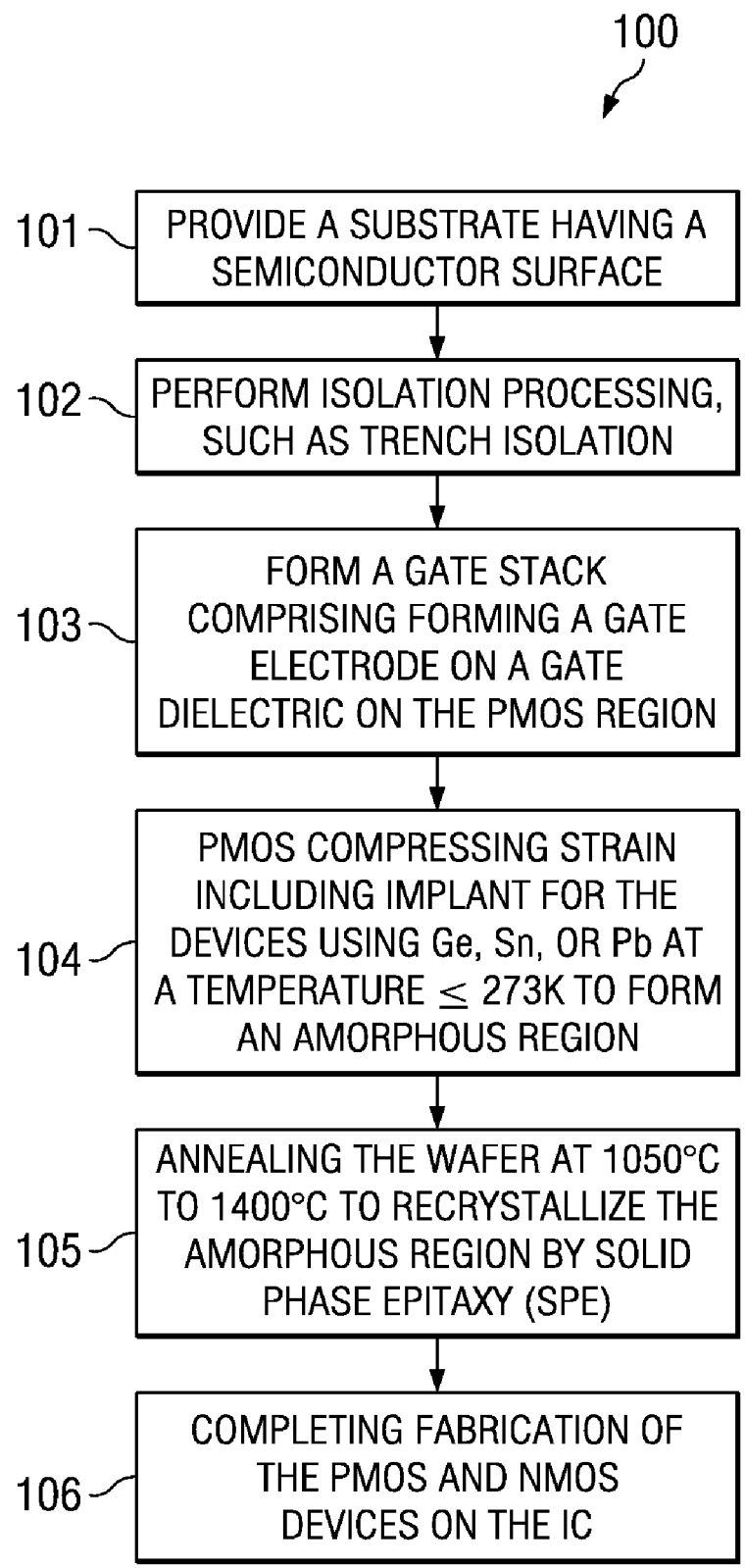
FIG. 1 is an exemplary process flow for forming an IC including a plurality of compressively strained PMOS devices that have substantially reduced end-of-range disorder, according to an embodiment of the invention.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

One embodiment of the invention comprises methods for forming an IC including a plurality of compressively strained PMOS devices that have substantially reduced end-of-range disorder and thus reduced defectivity, for which an exemplary process flow 100 is shown in FIG. 1. Step 101 comprises providing a substrate wafer having a semiconductor surface including at least one PMOS (e.g. n−) region. The semiconductor substrate can be single crystal silicon, silicon-on-insulator (SOI), the like, or combinations of the above. Step 102 generally comprises isolation processing, such as trench isolation (e.g. STI) processing.

Step 103 comprises forming a patterned gate stack comprising a gate electrode on a gate dielectric on a surface of the PMOS region. In a typical embodiment, the gate dielectric comprises silicon oxide or silicon oxynitride, and the gate electrode comprises polysilicon. The gate dielectric may also be a deposited dielectric, including a high-k dielectric that generally has a k-value>10.

Step 104 comprises implanting the PMOS region on opposing sides of the gate stack into the PMOS regions which will be source and drain (or extensions thereof) using implant conditions comprising at least one Group IV compressive strain inducing specie selected from Ge, Sn and Pb. The compressive strain inducing implant can generally occur before or after spacer formation. In the case of pre-spacer implantation, as known in the art, the implant will reach the LDD region and thus be closer to the channel of the completed device as compared to post spacer implantation. In the case of CMOS ICs, the NMOS region is generally masked during this implant. As known in the art, such strain inducing species being larger as compared to silicon provides compressive stress when substituted into the silicon lattice.

The implant dose for the compressive strain inducing implant is generally between $1\times10^{15}$ cm$^{-2}$ and $1\times10^{17}$ cm$^{-2}$, such as around $1\times10^{16}$ cm$^{-2}$. The implant energy for this implant is generally from 20 keV to 300 keV. The compressive strain inducing implantation is performed at a temperature below room temperature, generally being at a temperature$\leq$273K, such as in a range from 77 K to 273K. The implant angle is generally 0 to 15 degrees, but can be higher. The above compressive strain inducing implantation conditions have been found to generally be sufficient to form an amorphous region centered at a depth near the projected range (Rp) of the implant. The sub-ambient wafer temperature during implantation has been found to generally extend the spatial extent of the amorphous region formed by the implant (as compared to conventional ambient and above implant temperatures) which has been found by the Present Inventor to lead to a much lower concentration of end-of-range disorder associated with the implant, such as $\leq10^{10}$ dislocation lines/cm$^2$, and generally $\leq10^8$ dislocation lines/cm$^2$.

Step 105 comprises annealing the wafer using annealing conditions comprising a peak anneal temperature of between 1050° C. and 1400° C. and an anneal time at the peak temperature of generally $\leq$10 seconds. This anneal activates the compressive strain inducing species and recrystallizes the amorphous region through SPE. The annealing generally comprises a rapid thermal anneal (RTA), flash lamp anneal, or laser anneal. The laser anneal can be a flash anneal. In one embodiment of the invention the laser or flash lamp anneal may be followed by a non-melt spike anneal. The spike anneal can comprise an RTA or a laser anneal. In the case of a laser anneal, the time can be $\leq$10 msec, such as between about 0.1 msec and 10 msec. In one embodiment the annealing comprises a 1050° C. to 1150° C. RTA spike anneal and a laser anneal at 1200° C. to 1300° C. for $\leq$10 msec. The RTA spike anneal and a laser anneal can be in either order. The relatively short time annealing time at high temperature has been found to limit undesirable strain relaxation.

Step 106 comprises completing fabrication of the PMOS device and NMOS device on the IC, generally including conventional steps including spacer, silicide, source/drain, multi-layer metallization, and passivation. In one alternate embodiment of the invention, the anneal described above relative to step 105 can occur after source/drain implantation and thus be a single combined anneal that activates the source/drain implants and also provide SPE. However, for a polysilicon gate process, the polysilicon will generally not be activated all the way to the bottom of the gate so that an additional anneal may be helpful, such as an additional RTA spike anneal. For a metal gate flow, a single combined anneal can be the sole anneal and generally provide good device performance. In embodiments of the invention replacement gate processing may also be included.

In another embodiment of the invention, the compressive strain inducing implant (step 104) is performed before forming the gate stack (step 103), or after forming the gate dielectric but before forming the gate electrode. In this embodiment, the compressive strain inducing region extends along a full length of the PMOS channel region, in addition to being in the source/drain and LDD regions.

In yet another embodiment of the invention, a dislocation pinning species such as C, N or F may also be co-implanted with the compressive stress inducing species. The dislocation pinning species can further improve PMOS device performance by pinning the low density of dislocations that may remain. The compressive stress inducing species is generally implanted in a dose range from $2\times10^{14}$ to $5\times10^{15}$ cm$^{-2}$ in an energy in a range from 3 to 30 keV. The dislocation pinning species implant generally results in a minimum concentration of at least $1\times10^{18}$ cm$^{-3}$, generally being in a concentration range of at least $1\times10^{19}$ cm$^{-3}$.

Figure 2:
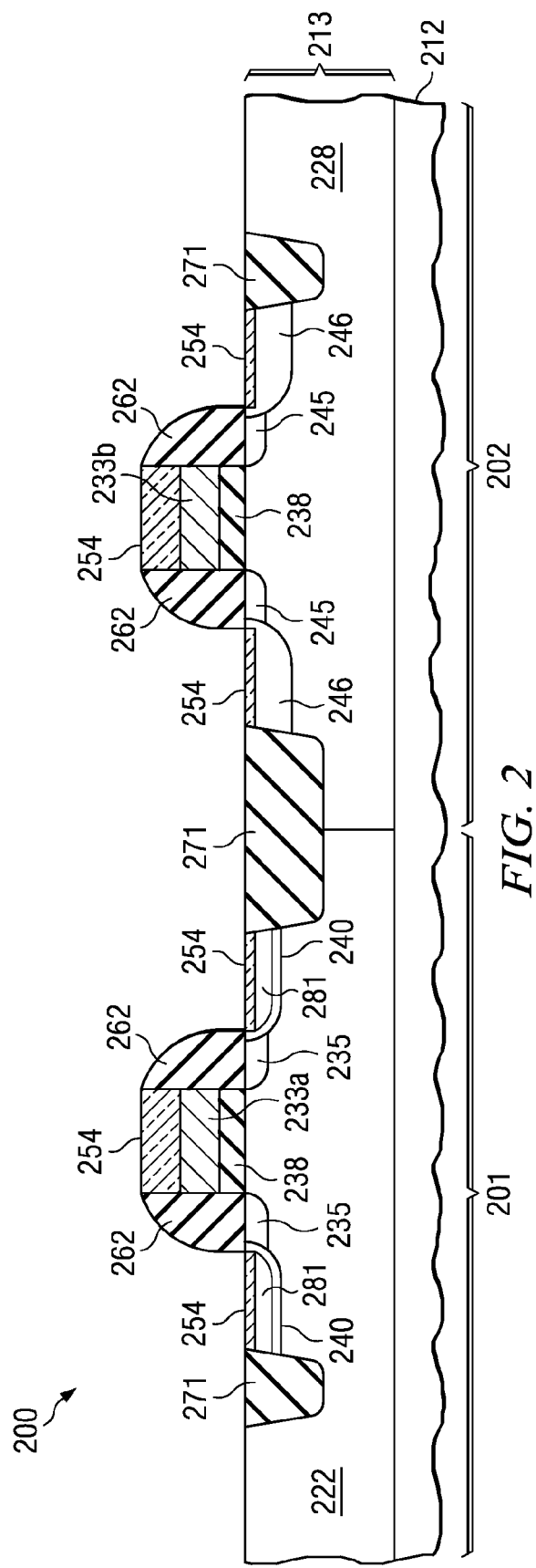
FIG. 2 is a cross sectional view of an IC including a PMOS and an NMOS device, with the PMOS device being a compressively strained PMOS device, according to an embodiment of the invention.

FIG. 2 is a cross sectional view of an IC 200 including a PMOS device 201 and an NMOS device 202, with the PMOS device 202 being a compressively strained PMOS device, according to an embodiment of the invention. IC 200 comprises a substrate 212 having a semiconductor surface 213.

Trench isolation 271 is shown. An Nwell 222 and a Pwell 228 are formed in the semiconductor surface 213. A gate stack for both PMOS device 201 and NMOS device 202 are formed in or on the surface 213. PMOS device 201 comprises gate electrode 233a generally P+ doped and NMOS device 202 comprises gate electrode 233b generally N+ doped), collectively referred to as gate electrode 233. A silicide layer 254 is shown on gate electrode 233 and a gate dielectric 238 is shown beneath the gate electrode 233, wherein a channel region is located in the semiconductor surface below the gate dielectric 238 for both PMOS device 201 and an NMOS device 202. A spacer 262 is on the sidewalls of the gate stack 254/233/238.

PMOS device 201 includes source/drain (SD) regions 240 positioned on opposing sides of the gate stack 254/233a/238. PMOS device 201 also includes SD extension (LDD) regions 235 positioned between the SD regions 240 and the channel region of PMOS device 201. PMOS device 201 includes compressive strain inducing regions 281 on both sides of the channel extending laterally to the trench isolation 271. Compressive strain inducing regions include Ge, Sn or Pb in a minimum active concentration of $10^{19}$ cm$^{-3}$, with portions providing active concentrations in excess of the equilibrium solid solubility limit. Although shown as only being on respective sides of the channel, as described above, in another embodiment of the invention there can be a single compressing strain inducing region that extends along a full length of the channel region. As described above, compressive strain inducing regions 281 can also include dislocation pinning species, such as C, N or F, generally in a minimum concentration of at least $1 \times 10^{18}$ cm$^{-3}$.

NMOS device 202 includes SD regions 246 positioned on opposing sides of the gate stack 254/233b/238. NMOS device 202 includes SD extension (LDD) regions 245 positioned between the SD regions 246 and the channel region of NMOS device 202.

Embodiments of the invention can be integrated into a variety of process flows to form a variety of devices and related products. The semiconductor substrates may include various elements therein and/or layers thereon. These can include barrier layers, other dielectric layers, device structures, active elements and passive elements including source regions, drain regions, bit lines, bases, emitters, collectors, conductive lines, conductive vias, etc. Moreover, the invention can be used in a variety of processes including bipolar, CMOS, BiCMOS and MEMS.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

I claim:

1. An integrated circuit (IC) including at a plurality of compressively strained PMOS transistors, comprising:
    a substrate having a semiconductor surface,
    wherein each of said plurality of compressively strained PMOS transistors comprise:
    a gate stack formed in or on said semiconductor surface comprising a gate electrode on a gate dielectric, wherein a channel region is located in said semiconductor surface below said gate dielectric;
    a source and a drain region on opposing sides of said gate stack;
    at least one compressive strain inducing region comprising at least one specie selected from Ge, Sn and Pb located in at least a portion of said source and drain regions, wherein said strain inducing region provides $\leq 10^{10}$ dislocation lines/cm$^2$ and an active concentration of said compressive strain inducing specie is above a solid solubility limit for said compressive strain inducing specie in said compressive strain inducing region.

2. The IC of claim 1, wherein said compressive strain inducing region provides $\leq 10^8$ dislocation lines/cm$^2$ and an active concentration of said compressive strain inducing specie is at least 2× said solid solubility limit for said compressive strain inducing specie in said compressive strain inducing region.

3. The IC of claim 1, wherein said compressive strain inducing region includes at least one dislocation pinning species comprising C, N or F, wherein a minimum concentration of said dislocation pinning species is at least $1 \times 10^{18}$ cm$^{-3}$.

4. The IC of claim 1, wherein said at least one compressive strain inducing specie consists essentially of said Sn.

5. The IC of claim 1, wherein said compressive strain inducing region extends along a full length of said channel region.

* * * * *